US006447663B1

(12) United States Patent
Lee et al.

(10) Patent No.: US 6,447,663 B1
(45) Date of Patent: Sep. 10, 2002

(54) PROGRAMMABLE NANOMETER-SCALE ELECTROLYTIC METAL DEPOSITION AND DEPLETION

(75) Inventors: James Weifu Lee, Oak Ridge, TN (US); Elias Greenbaum, Oak Ridge, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 176 days.

(21) Appl. No.: 09/694,978

(22) Filed: Oct. 24, 2000

Related U.S. Application Data
(60) Provisional application No. 60/222,576, filed on Aug. 1, 2000.

(51) Int. Cl.$^7$ .............................. C25D 5/18; C25F 3/00
(52) U.S. Cl. ...................... 205/104; 205/118; 205/122; 205/640; 205/646
(58) Field of Search .......................... 205/81, 83, 104, 205/114, 115, 118, 122, 640, 641, 644, 645, 646

(56) References Cited

U.S. PATENT DOCUMENTS

| | | | |
|---|---|---|---|
| 4,885,066 A | * 12/1989 | Kuwabara et al. | 204/129.43 |
| 4,994,154 A | * 2/1991 | Chen et al. | 204/16 |
| 5,022,955 A | * 6/1991 | Chen | 156/627 |
| 5,433,797 A | * 7/1995 | Erb et al. | 148/304 |
| 5,605,615 A | * 2/1997 | Goolsby et al. | 205/83 |
| 5,833,835 A | * 11/1998 | Gimaev et al. | 205/645 |
| 6,262,426 B1 | * 7/2001 | Zafiratos | 250/492.2 |

OTHER PUBLICATIONS

Morpurgo, A. F. et al, "Controlled Fabrication of Metallic Electrodes with Atomic Separation," Applied Physics Letters, vol. 74 (No. 14), p. 2084–2086, (Apr. 5, 1999).

Lee, James Weifu et al, "Molecular Ionic Probes: A New Class of Hill Reagents and Their Potential for Nanofabrication and Biometallocatalysts," J. Phys. Chem. B, vol. 102 (no. 11), p. 2095–2100, (Feb. 18, 1998).

Greenbaum, E., "Interfacial Photoreactions at the Photosynthetic Membrane Interface: An Upper Limit for the Number of Platinum Atoms Required to Form a Hydrogen–Evolving Platinum Metal Catalyst," Journal of Phy. Chem. (1988), vol. 92 (No. 16), p. 4571–4574.

Lee, James Weifu et al, "Photosynthetic Water Splitting: In Situ Photopreciptation of Metallocatalysts for Photoevolution of Hydrogen and Oxygen," Energy & Fuels (1994), vol. 8 (No. 3), p. 770–773.

Schuster, Rolf et al, "Electrochemical Micromachining," Science, p. 98–101, (Jul. 7, 2000).

* cited by examiner

*Primary Examiner*—Nam Nguyen
*Assistant Examiner*—William T. Leader
(74) *Attorney, Agent, or Firm*—Joseph A. Marasco

(57) ABSTRACT

A method of nanometer-scale deposition of a metal onto a nanostructure includes the steps of: providing a substrate having thereon at least two electrically conductive nanostructures spaced no more than about 50 μm apart; and depositing metal on at least one of the nanostructures by electric field-directed, programmable, pulsed electrolytic metal deposition. Moreover, a method of nanometer-scale depletion of a metal from a nanostructure includes the steps of providing a substrate having thereon at least two electrically conductive nanostructures spaced no more than about 50 μm apart, at least one of the nanostructures having a metal disposed thereon; and depleting at least a portion of the metal from the nanostructure by electric field-directed, programmable, pulsed electrolytic metal depletion. A bypass circuit enables ultra-finely controlled deposition.

22 Claims, 5 Drawing Sheets

US 6,447,663 B1

PROGRAMMABLE NANOMETER-SCALE ELECTROLYTIC METAL DEPOSITION AND DEPLETION

CROSS-REFERENCE TO RELATED APPLICATIONS

This application claims the benefit of U.S. Provisional Application No. 60/222,576, filed on Aug. 1, 2000, the entire disclosure of which is incorporated herein by reference The United States Government has rights in this invention pursuant to contract no. DE-AC05-00OR22725 between the United States Department of Energy and UT-Battelle, LLC.

FIELD OF THE INVENTION

The present invention relates to methods of nanometer-scale deposition and/or depletion of nanostructures in liquids at ambient temperature and neutral pH, and more particularly to such methods that involve electric field-directed, programmable, pulsed electrolytic metal deposition and/or depletion with precise control for nanofabrication.

BACKGROUND OF THE INVENTION

It has been demonstrated that hexachloroplatinate ($[PtCl_6]^{2-}$) and hexachloroosmiate ($[OsCl_6]^{2-}$) can be photoconverted to metallic platinum and osmium at the reducing site of Photosystem I (PSI) in thylakoid membranes via the Hill reaction, as shown in FIG. 1. In the search for additional compounds that can be used for photodeposition of metallocatalysts at the reducing site of PSI in thylakoid membranes, various selected compounds were assayed by simultaneously measuring $H_2$ and $O_2$ production in a helium atmosphere using a reactor-flow detection system. In addition to confirmation of earlier findings with $[PtCl_6]^{2-}$ and $[OsCl_6]^{2-}$, it was found that $PtCl_4$, $OSCl_3$, $(NH_4)_2RuCl_6$, and $K_3RuCl_6$ can also support simultaneous $H_2$ and $O_2$ photoevolution after photoprecipitation. For further information, see James W. Lee, et al., *Molecular Ionic Probes: A New Class of Hill Reagents and Their Potential for Nanofabrication and Biometallocatalysis*, J. Phys. Chem. B, 1998, vol. 102, p. 1095–2100.

Research has demonstrated that the growth of metallic particles can be controlled by photosynthetic reactions. Using single-turnover flashes, atom-by-atom growth of metallic platinum has been previously achieved. The size of metallic platinum particles grown at the reducing site of PSI can be determined by the number of actinic flashes.

In the development and/or manufacture of nanometer devices, it is often essential to have convenient and cost-effective methods for manipulating the size of a nanometer gap, for adding and/or deleting an additional metal species at the gap, and/or connecting nanostructures at a precise location. The present invention uses the foundation laid by the above-described research to achieve these goals.

OBJECTS OF THE INVENTION

Accordingly, objects of the present invention include: convenient and cost-effective methods for manipulating the size of a nanometer gap, depositing and/or depleting an additional metal species at the gap, and/or connecting nanostructures at a precise location. Further and other objects of the present invention will become apparent from the description contained herein.

SUMMARY OF THE INVENTION

In accordance with one aspect of the present invention, the foregoing and other objects are achieved by a method of nanometer-scale deposition of a metal onto a nanostructure including the steps of providing a substrate having thereon at least two electrically conductive nanostructures spaced no more than about 50 $\mu$m apart; and depositing metal on at least one of the nanostructures by electric field-directed, programmable, pulsed electrolytic metal deposition.

In accordance with another aspect of the present invention, a method of nanometer-scale deposition of a metal onto a nanostructure includes the steps of providing a substrate having thereon at least two nanostructures having opposing tips spaced no more than 10 $\mu$m apart so that an electric field is strongest between the tips to facilitate an electrolytic metal deposition reaction on at least one of the tips; and depositing metal on at least one of the tips by precisely controlling the amount of electrolytic metal deposition using a programmable pulsed current source to control the number of electrons used in the electrolytic deposition reaction to achieve a deposition rate in the range of 1500 to $10^{14}$ metal atoms per pulse.

In accordance with a further aspect of the present invention, a method of nanometer-scale depletion of a metal from a nanostructure includes the steps of: providing a substrate having thereon at least two electrically conductive nanostructures spaced no more than about 50 $\mu$m apart, at least one of the nanostructures having a metal disposed thereon; and depleting at least a portion of the metal from the nanostructure by electric field-directed, programmable, pulsed electrolytic metal depletion.

In accordance with another aspect of the present invention, a method of nanometer-scale depletion of a metal from a nanostructure comprising the steps of: providing a substrate having thereon at least two nanostructures having opposing tips spaced no more than 10 $\mu$m apart so that an electric field is strongest between the tips to facilitate an electrolytic metal depletion reaction from at least one of the tips, at least one of the tips having a metal disposed thereon; and depleting at least a portion of the metal from the tip by precisely controlling the amount of electrolytic metal depletion using a programmable pulsed current source to control the number of electrons used in the electrolytic depletion reaction to achieve a depletion rate in the range of 1500 to $10^{14}$ metal atoms per pulse.

For a better understanding of the present invention, together with other and further objects, advantages and capabilities thereof, reference is prepared to the following disclosure and appended claims in connection with the above-described drawings.

DETAILED DESCRIPTION OF THE INVENTION

The present invention is a novel method to perform nanometer-scale deposition and/or depletion of nanostructures in liquids at preferably ambient temperature and preferably neutral pH through electric field-directed, programmable, pulsed electrolytic metal deposition or depletion. The use of pulsed current is a critical feature of the present invention. Temperature and pH are not critical parameters in the present invention. Application of a programmable and short (ns-ms time scale) pulsing direct current source is used to control the number of atoms being deposited by the electrolytic metal reduction and deposition process. As shown in the following platinum deposition reaction at a cathode using water-soluble hexachloroplatinate, the number of electrons supplied can control the formation of metallic platinum. In electrolytic deposition, electric current and the duration of the current can control the number of electrons.

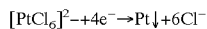

$[PtCl_6]^{2-} + 4e^- \rightarrow Pt\downarrow + 6Cl^-$

Other water-soluble metal compounds that have been shown to be applicable to the present invention include, but are not limited to: $PtCl_4$, $OsCl_3$, $Na_2[PtCl_6]$, $Na_2[OsCl_6]$, $(NH_4)_2RuCl_6$, $K_3RuCl_6$, $Na_2PdCl_6$, $Na_2IrCl_6$, $(NH_4)_3RhCl_6$, $(NH_4)_6Mo_7O_{24}$, $(NH_4)_2PdCl_4$, $Pd(NH_3)_4Cl_2$, $ReCl_3$, $NiCl_2$, $CoCl_2$, $PtO_2$, $PtCl_2$, $Pt(NH_3)_4Cl_2$, $(NH_4)_6Mo_7O_{24}$, $NaAuCl_4$, $K_2[PtCl_4]$, and $K_3Fe(CN)_6$. Combinations of two or more water-soluble metal compounds can be used sequentially or simultaneously in accordance with the present invention.

Figure 1:
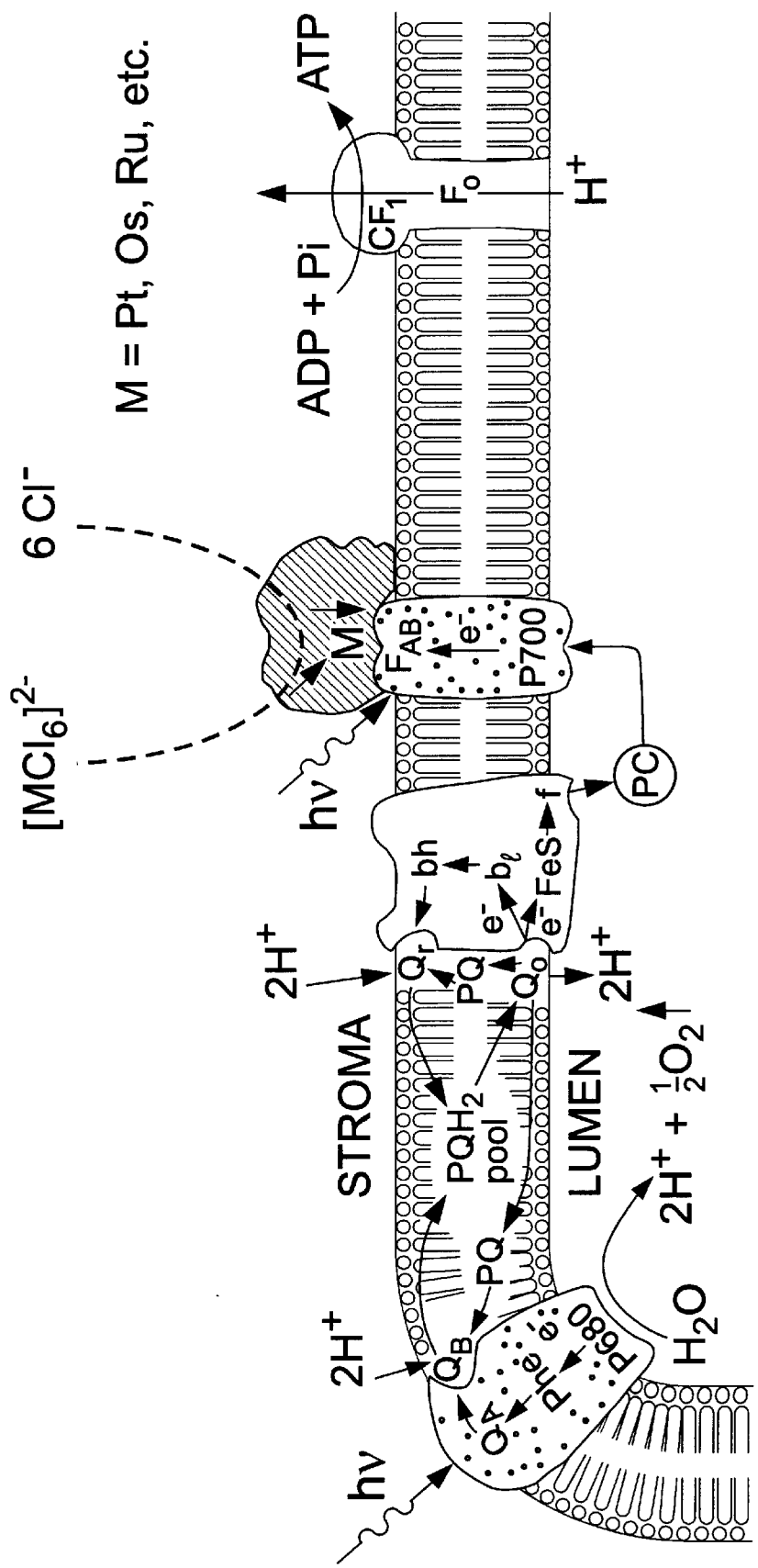
FIG. 1 is an illustration of photoconversion of hexachloroplatinate ($[PtCl_6]^{2-}$), hexachloroosmiate ($[OsCl_6]^{2-}$), and hexachlororuthenate ($[RuCl_6]^{2-}$) to metallic platinum, osmium, and ruthenium at the reducing site of photosystem I (PSI) in a thylakoid membrane through the Hill reaction.
Figure 2:
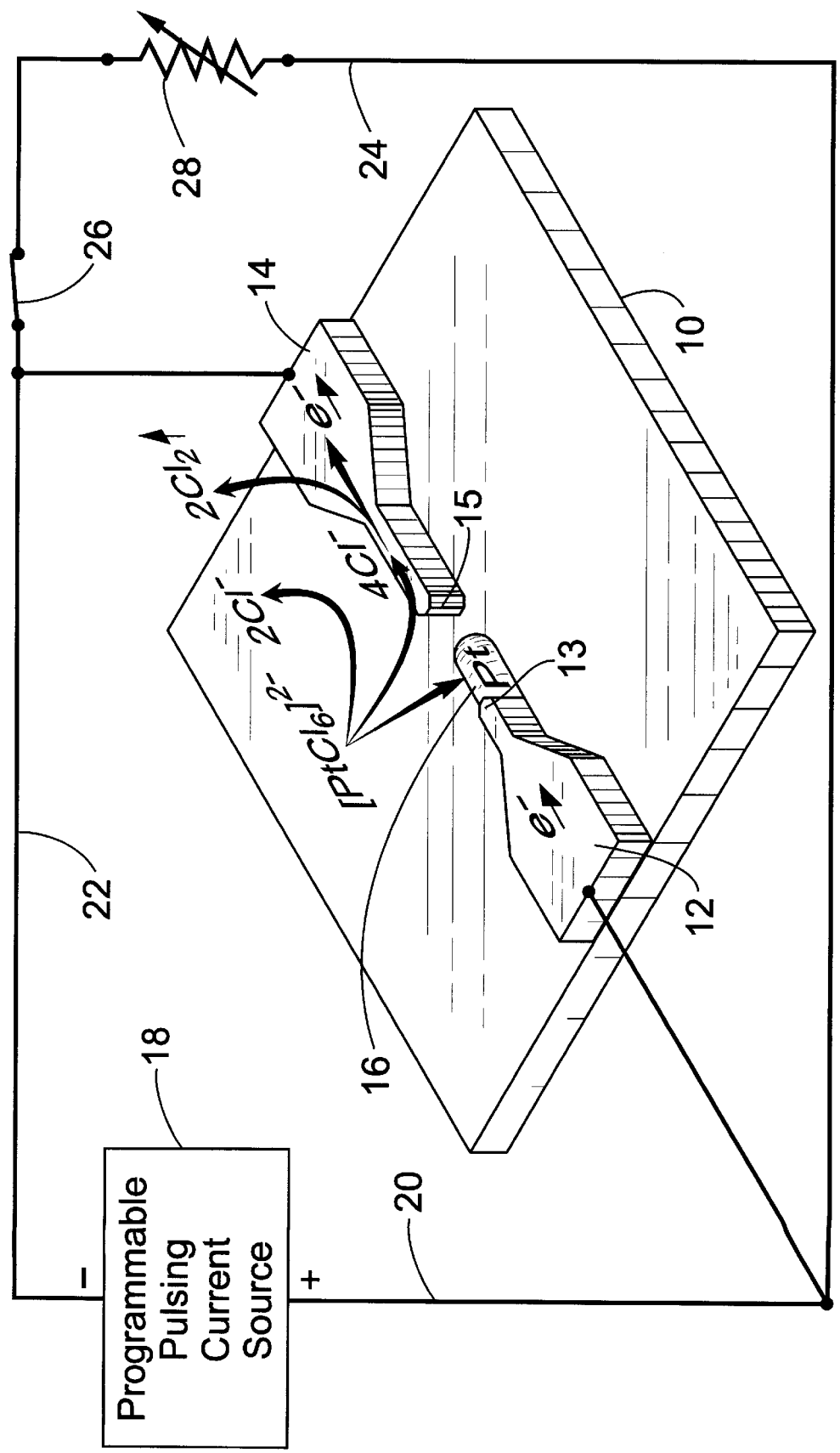
FIG. 2 is an illustration of deposition of platinum (Pt) on a gold nanostructure in accordance with the present invention.

As illustrated in FIG. 2, an embodiment of the invention involves a special utilization of a programmable current source that can precisely control the number of electrons used to achieve the desired nanometer-scale electrolytic metal deposition. A non-conductive substrate 10 supports nanometer sized electrodes, also called nanowires and nanoelectrodes—cathode 12 and anode 14—which are usually comprised of gold but can be other metals or conductive materials. Spacing between the nanoelectrode tips 13, 15 in the range of 1–10 μm produces good results using the present invention.

A preselected metal 16 is deposited via the method of the present invention onto the tip of the cathode 12. The metal 16 is usually Pt, but can be any metal that can be deposited electrolytically. A programmable, pulsable current source 18 has electrical connections 20, 22 to the respective nanoelectrodes 12, 14. A bypass circuit 24 is shown, which includes a bypass selector switch 26 and a variable resistor 28.

Nanoelectrodes 12, 14 represent a subset of microscopic sized structures (nanostructures) that are suitable for use with the present invention. Nanostructures acting as electrodes can be of various sizes and shapes. Spacing between the two nanostructures should not exceed 50 μm, preferably 20 μm, more preferably, 10 μm, most preferably, 5 μm.

The programmable, pulsable current source 18 can be of any suitable construction. Keithley Model 220 programmable current source or the latest Keithley Model 2400 series of Source Meters (available from Keithley Instruments, Inc., 28775 Aurora Road, Cleveland, Ohio 44139, or on the Internet at www.keithley.com) are already capable of supplying a minimum of about 9400 electrons per pulse [500 fA×3 ms×electron/(1.60×10$^{19}$ C)], which could translate to a deposition of 2350 platinum atoms per pulse based on the stoichiometry of the deposition reaction. If this amount of platinum is deposited on the end of a nanowire with a 10- by 10-nm cross section, 2350 platinum atoms per pulse can translate into about 1 rim of metal deposition (2.6 layers of platinum atoms) per pulse. The programmable, pulsable current source 18 should be capable of controlling the process so that nanometer metal deposition or depletion as precise as about 1500 metal 16 atoms per pulse can be achieved. A preferable range is contemplated to be 1500–10$^{14}$ atoms per pulse, although the skilled artisan will recognize that the present invention can operate well beyond this range.

The bypass circuit 24 is preferably added to fine-tune the electron flow for even more precise control of deposition or depletion—the addition or removal of monolayers or sub-monolayers of atoms—that can be achieved by the present invention. The bypass circuit 24 is used to divert some of the electricity away from the nanoelectrodes 12, 14 in order to deposit or deplete fewer metal atoms per pulse. For example, when the impedance of the variable resistor 28 is adjusted to 50% of the impedance between the two nanoelectrodes 12, 14, two thirds of the 9400 electrons per pulse can be drained through the bypass circuit 24. In this case, the electrolytic metal deposition can be controlled to a step as precise as 780 platinum atoms (3130 electrons) per pulse, which can be translated to a deposition of 0.87 layer of platinum atoms 16 on a 10- by 10-nm surface at the tip of the cathodic nanoelectrode 12. By allowing a greater portion of the current to flow through the bypass circuit 24, it is possible to control deposition of metal 16 atoms as precise as 100 atoms per pulse. A preferable range for this extremely finely controlled deposition is contemplated to be 100–2500 atoms per pulse, although the skilled artisan will recognize that the present invention can operate well beyond this ultrafine deposition range.

The bypass circuit 24 can also protect the nanometer structure from electrostatic damage, especially when the structure is dry. For example, after desired programmable electrolytic metal deposition is achieved as illustrated in FIG. 2, the bypass circuit 24 should remain connected with the nanostructures 12 and 14 while the programmable pulsing current source can then be removed. As long as the bypass circuit remains connected with the nanostructures 12 and 14, any electrostatic charges that might be created during wash and dry of the nanostructures will be able to flow through the bypass circuit 24 that, in this case, comprises the closed switch 26, the variable resistor 28, and wires that connect the switch 26 and the variable resistor 28 with the nanoelectrodes 12, 14. This prevents accumulation of electrostatic charges at any one of electrodes against the other electrode from occurring, thus eliminating the possibility of electrostatic damage at the nanometer gap between the tips 13, 15 of the nanoelectrodes 12, 14.

Figure 3:
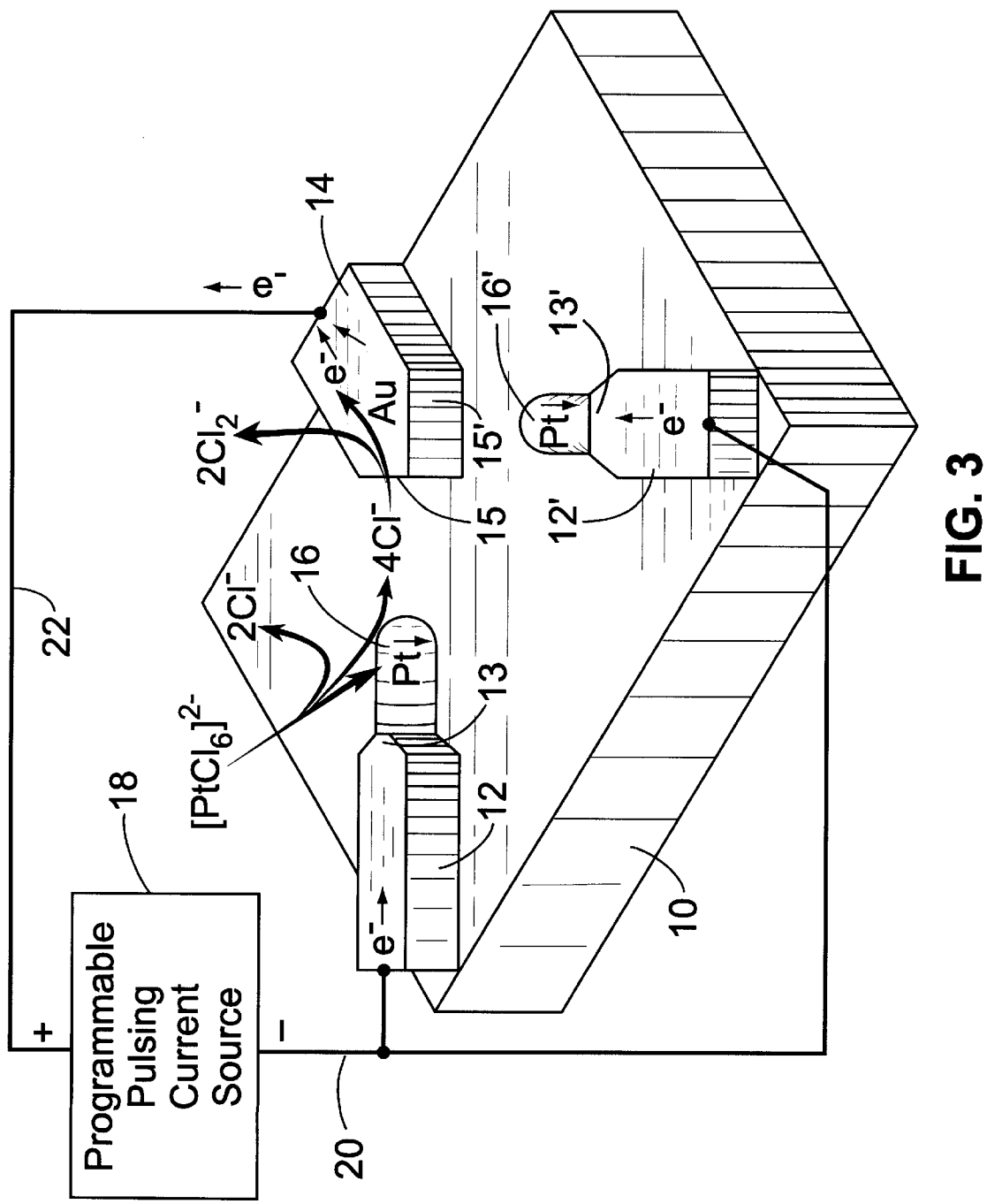
FIG. 3 is an illustration of deposition of platinum (Pt) on multiple gold nanostructures in accordance with the present invention.

A special nanostructural arrangement can be used to control the initiation point(s) of nanometer bonding. According to the present invention, special structural arrangements of the nanowire electrodes can now be made by various lithographic techniques to control the initiation point(s) of the electrolytic metal deposition. As shown in FIG. 3, multiple nanowire cathodes 12, 12' should have respective tips 13, 13' pointing to the respective tips 15, 15' of nanowire anode 14 so that the strongest electric field is therebetween. Spacing of the multiple nanowire cathodes 12, 12' should be regulated to ensure deposition of metal 16, 16' at the desired cathode location, because the electric field (E) is a vector that is strongly dependent on distance (r):

$E \propto r^{-2}$

Figure 4:
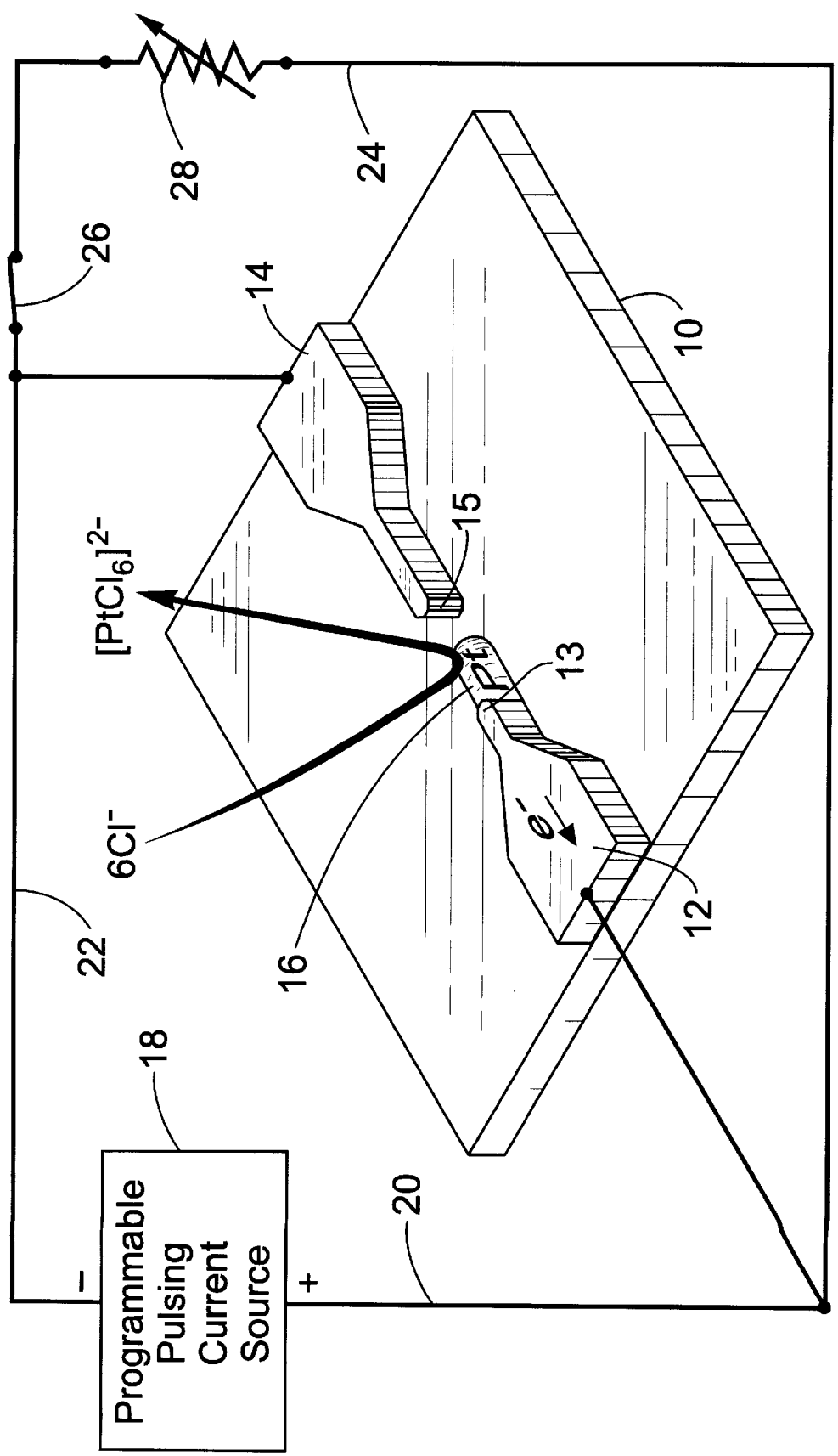
FIG. 4 is an illustration of depletion of platinum (Pt) from a gold nanostructure in accordance with the present invention.

Electrolytic metal-dissolving reactions are applied to deplete metal—open nanometer gaps and control gap size as shown in FIG. 4. By conducting the reversal of the metal deposition reaction with sodium chloride solution instead of hexachloroplatinate as an electrolytic substrate, metallic platinum at the anode tip(s) 16 can be electrolytically depleted via dissolution in a controllable way according to the following reaction:

$$Pt + 6Cl^- \rightarrow [PtCl_6]^{2-} + 4e^-$$

This metal-dissolution reaction should also be able to control the gap size between the nanoelectrode tips 13, 15. The site and the extent of electrolytic metal depletion can also be controlled by proper selection of the desired polarity of the electric field and by use of a programmable current source with a bypass circuit, as described herein.

The salient features of the present invention, as described hereinabove, may be applied in full, in part, or in any combination. Any number of nanostructures can be simultaneously bonded or dissolved on a particular substrate.

For metal deposition, the nanostructure to be metal-deposited does not have to be metal. This invention can be used to connect any conductive nanowires such as, for example, nanotubes, especially carbon nanotubes, because of their capability for nanometer electrolytic metal deposition.

For metal depletion, the nonmetallic ions do not have to be $Cl^-$. Any anions, such as $F^-$ and $CN^-$, that can electrolytically dissolve metals (Pt, Pd, Au, etc.) may be used as alternative versions of the invention.

Any industries that need nanofabrication technologies may use this invention. Its programmable feature in nanometer metal deposition and dissolution is especially suitable for its application in industrial manufacturing of miniature circuits and devices. Because of its potential cost-effectiveness, this invention is anticipated to be applicable for the development and manufacturing of micrometer and/or nanometer devices and components, especially for the manufacturing of electronic-related components where the present invention can be easily employed. Therefore, high-technology electronic and/or computer industries are likely to be its immediate market.

Figure 5:
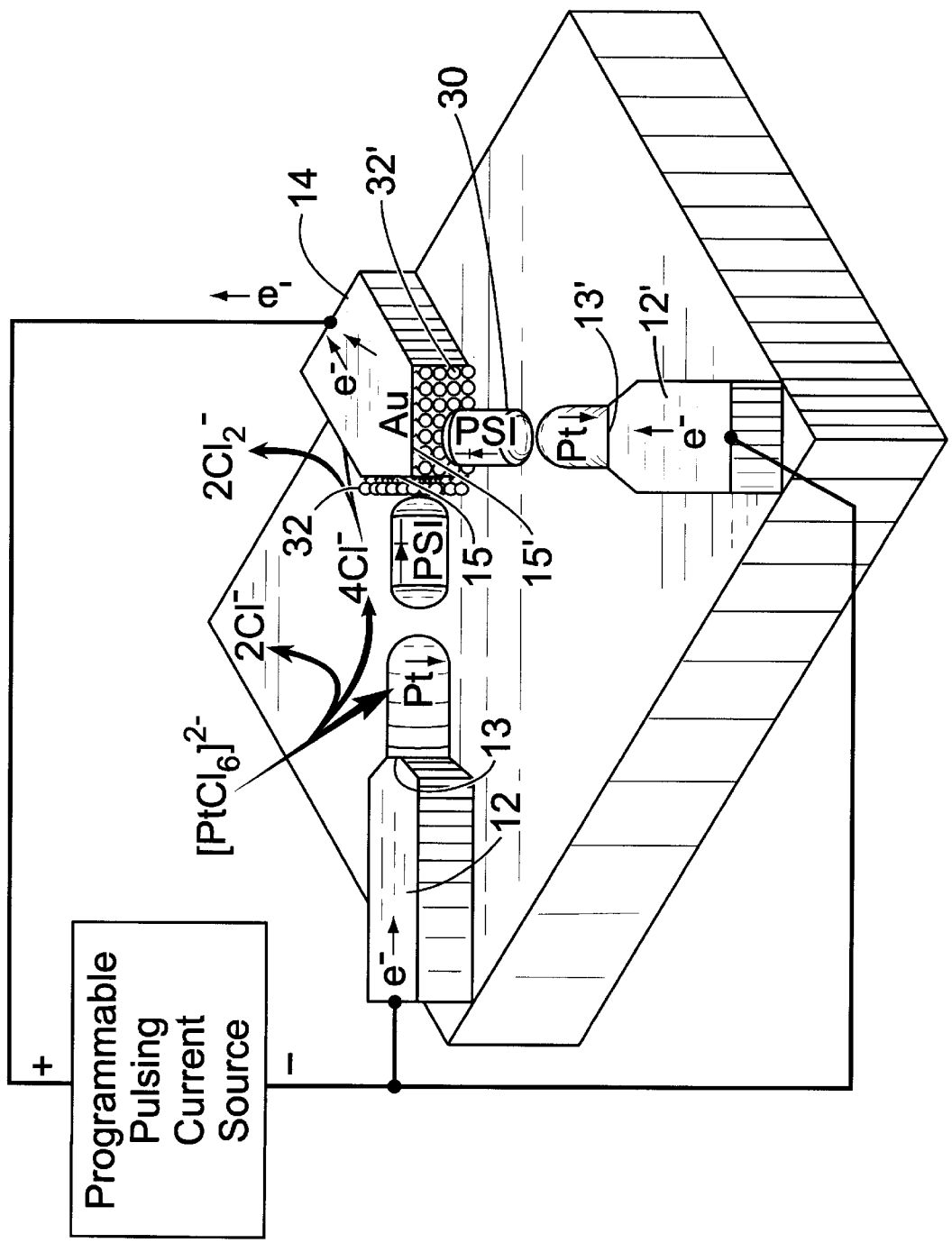
FIG. 5 illustrates an example that uses the method of the present invention to construct a photosystem I (PSI) logic device at a nanometer scale.

For example, the present invention can be useful in construction of Photosystem I (PSI) logic devices—potentially a new generation of electronic devices. It has been demonstrated that PSI is a 6-nm particle that has diodic properties. Therefore, PSIs can potentially be used to create nanometer circuits such as a logic device. As illustrated in FIG. 5, PSIs 30 can self-assemble onto a nanoanode 14 having tips 15, 15' with mercaptoacetate-modified gold surfaces 32, 32' with their diodic polarities pointing toward the mercaptoacetate-modified gold surfaces 32, 32'. The smallest gap that the current electron-beam lithographic techniques can reliably make is about 25 nm. However, a 25-nm gap is too large for a PSI that is anchored onto the mercaptoacetate-modified gold surface 32 to make proper electrical communication with the cathode. Use of the present invention closes the two 25-nm gaps by electrolytic deposition of metallic platinum at the two nanocathode 12, 12' tips 13, 13' step-by-step toward the PSIs until the two metallic platinum tips make proper electrical communication with the two PSIs, consequently resulting in an nanometer-scale AND logic gate.

While there has been shown and described what are at present considered the preferred embodiments of the invention, it will be obvious to those skilled in the art that various changes and modifications can be prepared therein without departing from the scope of the inventions defined by the appended claims.

What is claimed is:

1. A method of nanometer-scale deposition of a metal onto a nanostructure comprising the steps of:
   a. providing a substrate having thereon at least two electrically conductive nanostructures spaced no more than about 50 μm apart; and
   b. depositing metal on at least one of said nanostructures by electric field-directed, programmable, pulsed electrolytic metal deposition.

2. A method in accordance with claim 1 wherein said metal is supplied through electrolytic reduction of at least one water-soluble metal compound.

3. A method in accordance with claim 2 wherein said water-soluble metal compound is selected from the group consisting of $PtCl_4$, $OsCl_3$, $Na_2[PtCl_6]$, $Na_2[OsCl_6]$, $(NH_4)_2RuCl_6$, $K_3RuCl_6$, $Na_2PdCl_6$, $Na_2IrCl_6$, $(NH_4)_3IrCl_6$, $(NH_4)_3RhCl_6$, $K_2PdCl_4$, $(NH_4)_2PdCl_4$, $Pd(NH_3)_4Cl_2$, $ReCl_3$, $NiCl_2$, $CoCl_2$, $PtO_2$, $PtCl_2$, $Pt(NH_3)_4Cl_2$, $(NH_4)_6Mo_7O_{24}$, $NaAuCl_4$, $K_2[PtCl_4]$, and $K_3Fe(CN)_6$.

4. A method in accordance with claim 1 wherein said depositing step further comprises controlling the number of atoms deposited per pulse.

5. A method in accordance with claim 4 wherein said depositing step further comprises using a bypass circuit to further control the number of atoms deposited per pulse.

6. A method in accordance with claim 1 wherein at least one of said nanostructures further comprises a nanowire.

7. A method in accordance with claim 1 wherein at least one of said nanostructures further comprises a nanotube.

8. A method of nanometer-scale deposition of a metal onto a nanostructure comprising the steps of:
   a. providing a substrate having thereon at least two nanostructures having opposing tips spaced no more than 10 μm apart so that an electric field is strongest between said tips to facilitate an electrolytic metal deposition reaction on at least one of said tips; and
   b. depositing metal on at least one of said tips by precisely controlling the amount of electrolytic metal deposition using a programmable pulsed current source to control the number of electrons used in the electrolytic deposition reaction to achieve a deposition rate in the range of 100 to $10^{14}$ metal atoms per pulse.

9. A method in accordance with claim 8 wherein said metal is supplied through electrolytic reduction of at least one water-soluble metal compound.

10. A method in accordance with claim 9 wherein said water-soluble metal compound is selected from the group consisting of $PtCl_4$, $OsCl_3$, $Na_2[PtCl_6]$, $Na_2[OsCl_6]$, $(NH_4)_2RuCl_6$, $K_3RuCl_6$, $Na_2PdCl_6$, $Na_2IrCl_6$, $(NH_4)_3IrCl_6$, $(NH_4)_3RhCl_6$, $K_2PdCl_4$, $(NH_4)_2PdCl_4$, $Pd(NH_3)_4Cl_2$, $ReCl_3$, $NiCl_2$, $CoCl_2$, $PtO_2$, $PtCl_2$, $Pt(NH_3)_4Cl_2$, $(NH_4)_6Mo_7O_{24}$, $NaAuCl_4$, $K_2[PtCl_4]$, and $K_3Fe(CN)_6$.

11. A method in accordance with claim 8 wherein a bypass circuit is used to further control the number of electrons used in the electrolytic deposition reaction to achieve a deposition rate in the range of 100 to 2500 metal atoms per pulse.

12. A method in accordance with claim 8 wherein at least one of said nanostructures further comprises a nanowire.

13. A method in accordance with claim 8 wherein at least one of said nanostructures further comprises a nanotube.

14. A method of nanometer-scale depletion of a metal from a nanostructure comprising the steps of:
   a. providing a substrate having thereon at least two electrically conductive nanostructures spaced no more than about 50 μm apart, at least one of said nanostructures having a metal disposed thereon; and b. depleting at least a portion of said metal from said nanostructure by electric field-directed, programmable, pulsed electrolytic metal depletion.

15. A method in accordance with claim 14 wherein said depleting step further comprises controlling the number of atoms depleted per pulse.

16. A method in accordance with claim 15 wherein said depleting step further comprises using a bypass circuit to further control the number of atoms depleted per pulse.

17. A method in accordance with claim 14 wherein at least one of said nanostructures further comprises a nanowire.

18. A method in accordance with claim 14 wherein at least one of said nanostructures further comprises a nanotube.

19. A method of nanometer-scale depletion of a metal to a nanostructure comprising the steps of:
   a. providing a substrate having thereon at least two nanostructures having opposing tips spaced no more than 10 μm apart so that an electric field is strongest between said tips to facilitate an electrolytic metal depletion reaction from at least one of said tips, at least one of said tips having a metal disposed thereon; and
   b. depleting at least a portion of said metal from said tip by precisely controlling the amount of electrolytic metal depletion using a programmable pulsed current source to control the number of electrons used in the electrolytic depletion reaction to achieve a depletion rate in the range of 100 to $10^{14}$ metal atoms per pulse.

20. A method in accordance with claim 19 wherein a bypass circuit is used to further control the number of electrons used in the electrolytic depletion reaction to achieve a depletion rate in the range of 100 to 2500 metal atoms per pulse.

21. A method in accordance with claim 19 wherein at least one of said nanostructures further comprises a nanowire.

22. A method in accordance with claim 19 wherein at least one of said nanostructures further comprises a nanotube.

* * * * *